US008702273B2

(12) United States Patent
Popovich et al.

(10) Patent No.: US 8,702,273 B2
(45) Date of Patent: Apr. 22, 2014

(54) MOUNTING ARRANGEMENT AND METHOD FOR LIGHT EMITTING DIODES

(75) Inventors: John Popovich, Solana Beach, CA (US); Gregory W. Honegger, Bakersfield, CA (US)

(73) Assignee: Permlight Products, Inc., Tustin, CA (US)

( * ) Notice: Subject to any disclaimer, the term of this patent is extended or adjusted under 35 U.S.C. 154(b) by 0 days.

(21) Appl. No.: 13/482,958

(22) Filed: May 29, 2012

(65) Prior Publication Data

US 2012/0291259 A1    Nov. 22, 2012

Related U.S. Application Data

(63) Continuation of application No. 12/569,826, filed on Sep. 29, 2009, now Pat. No. 8,186,850, which is a continuation of application No. 11/842,145, filed on Aug. 21, 2007, now Pat. No. 7,594,740, which is a continuation of application No. 11/542,072, filed on Oct. 3, 2006, now Pat. No. 7,306,353, which is a continuation of application No. 10/789,357, filed on Feb. 27, 2004, now Pat. No. 7,114,831, which is a continuation of application No. 09/693,548, filed on Oct. 19, 2000, now Pat. No. 6,712,486.

(60) Provisional application No. 60/160,480, filed on Oct. 19, 1999, provisional application No. 60/200,531, filed on Apr. 27, 2000.

(51) Int. Cl.
*F21V 33/00* (2006.01)

(52) U.S. Cl.
USPC .................................... 362/249.02; 362/800

(58) Field of Classification Search
USPC .............................. 362/800, 249.02, 326, 244
See application file for complete search history.

(56) References Cited

U.S. PATENT DOCUMENTS 8,186,850 B2 * 5/2012 Popovich et al. ........ 362/249.02

* cited by examiner

*Primary Examiner* — Laura Tso
(74) *Attorney, Agent, or Firm* — Klein, O'Neill & Singh, LLP

(57) ABSTRACT

A modular light emitting diode (LED) mounting configuration is provided including a light source module having a plurality of pre-packaged LEDs arranged in a serial array. The module includes a heat conductive body portion adapted to conduct heat generated by the LEDs to an adjacent heat sink. As a result, the LEDs are able to be operated with a higher current than normally allowed. Thus, brightness and performance of the LEDs is increased without decreasing the life expectancy of the LEDs. The LED modules can be used in a variety of illumination applications employing one or more modules.

20 Claims, 19 Drawing Sheets

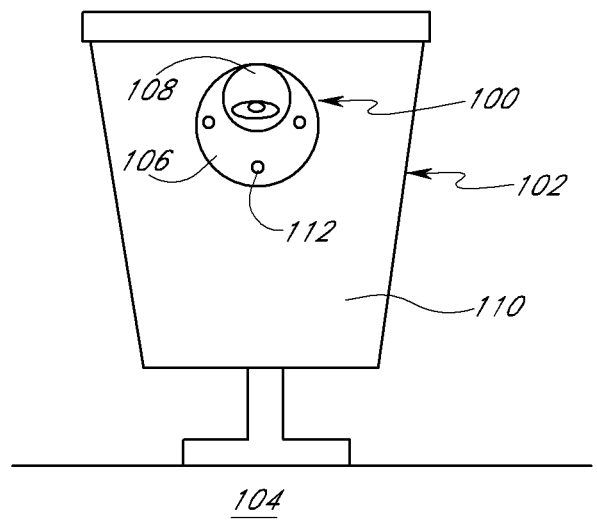
FIG. 13
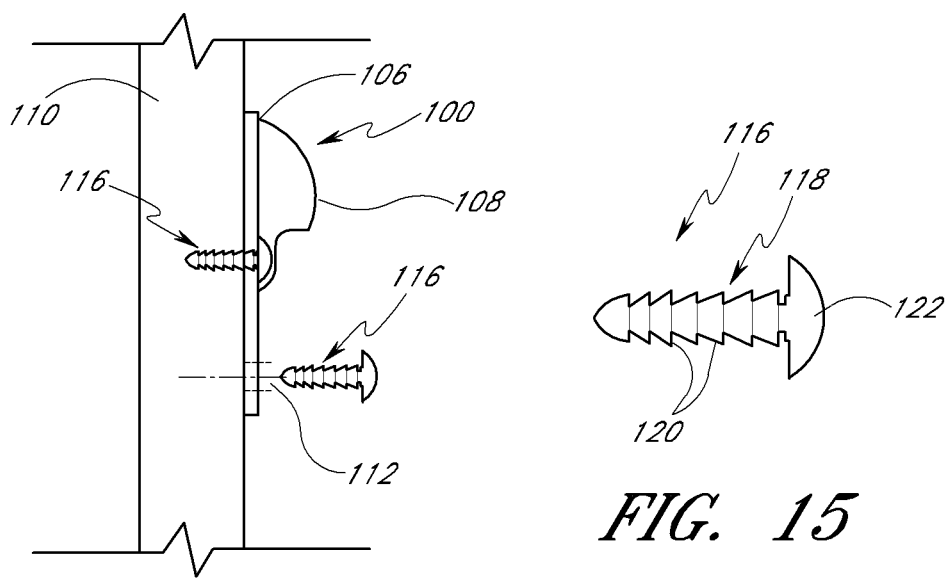
FIG. 14
FIG. 15

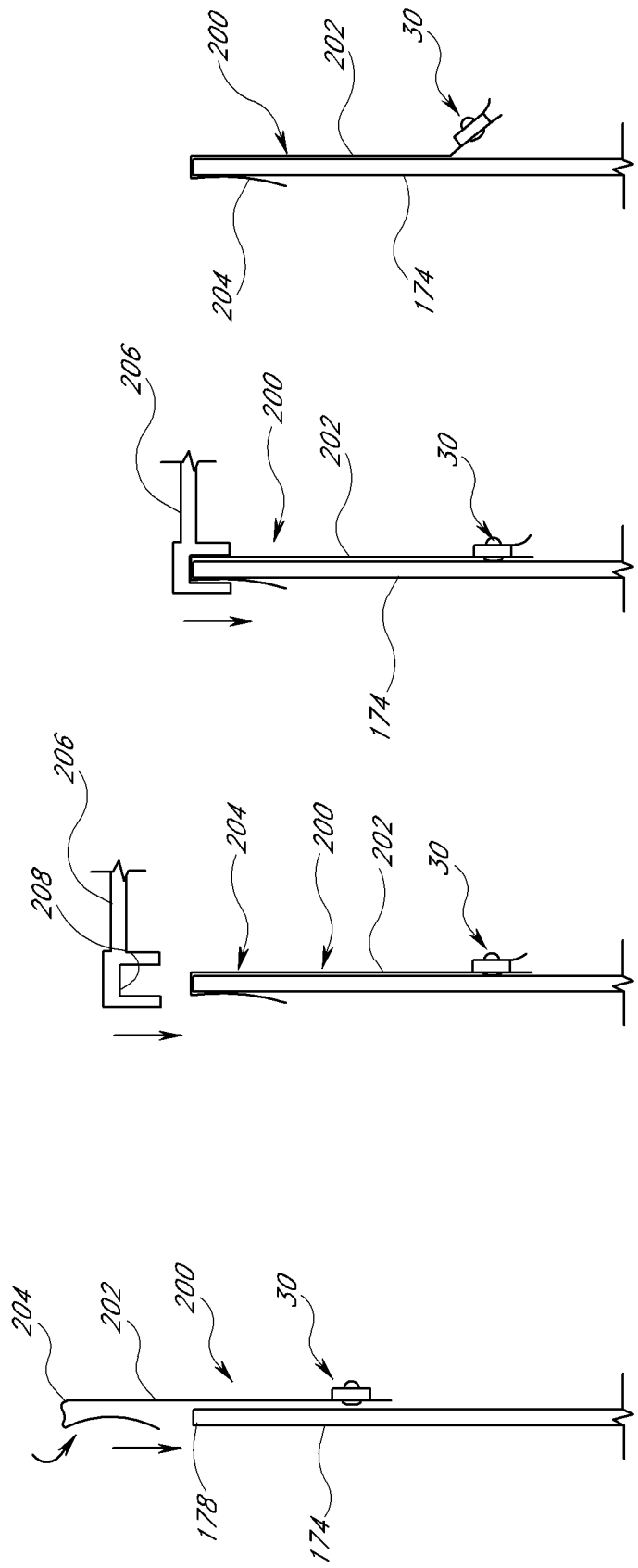

MOUNTING ARRANGEMENT AND METHOD FOR LIGHT EMITTING DIODES

RELATED APPLICATIONS

This application is a continuation of U.S. application Ser. No. 12/569,826, which was filed on Sep. 29, 2009, now U.S. Pat. No. 8,186,850 which is a continuation of U.S. application Ser. No. 11/842,145, which was filed on Aug. 21, 2007, now U.S. Pat. No. 7,594,740, which is a continuation of U.S. application Ser. No. 11/542,072, which was filed on Oct. 3, 2006, now U.S. Pat. No. 7,306,353, which is a continuation of U.S. application Ser. No. 10/789,357, which was filed on Feb. 27, 2004, now U.S. Pat. No. 7,114,831, which is a continuation of U.S. application Ser. No. 09/693,548, which was filed on Oct. 19, 2000, now U.S. Pat. No. 6,712,486, which claims the benefit of U.S. Provisional Patent Application Nos. 60/160,480, which was filed on Oct. 19, 1999 and 60/200,531, which was filed on Apr. 27, 2000. The entirety of each of these related applications is hereby incorporated by reference.

BACKGROUND OF THE INVENTION

1. Field of the Invention

The present invention is in the field of light emitting diode (LED) lighting devices and more particularly in the field of an LED lighting module having heat transfer properties that improve the efficiency and performance of LEDs.

2. Description of the Related Art

Light emitting diodes (LEDs) are currently used for a variety of applications. The compactness, efficiency and long life of LEDs is particularly desirable and makes LEDs well suited for many applications. However, a limitation of LEDs is that they typically cannot maintain a long-term brightness that is acceptable for middle to large-scale illumination applications. Instead, more traditional incandescent or gas-filled light bulbs are often used.

An increase of the electrical current supplied to an LED generally increases the brightness of the light emitted by the LED. However, increased current also increases the junction temperature of the LED. Increased juncture temperature may reduce the efficiency and the lifetime of the LED. For example, it has been noted that for every 10° C. increase in temperature, silicone and gallium arsenide lifetime drops by a factor of 2.5-3. LEDs are often constructed of semiconductor materials that share many similar properties with silicone and gallium arsenide.

SUMMARY OF THE INVENTION

Accordingly, there is a need in the art for an LED lighting apparatus having heat removal properties that allow an LED on the apparatus to operate at relatively high current levels without increasing the juncture temperature of the LED beyond desired levels.

In accordance with an aspect of the present invention, an LED module is provided for mounting on a heat conducting surface that is substantially larger than the module. The module comprises a plurality of LED packages and a circuit board. Each LED package has an LED and at least one lead. The circuit board comprises a thin dielectric sheet and a plurality of electrically-conductive contacts on a first side of the dielectric sheet. Each of the contacts is configured to mount a lead of an LED package such that the LEDs are connected in series. A heat conductive plate is disposed on a second side of the dielectric sheet. The plate has a first side which is in thermal communication with the contacts through the dielectric sheet. The first side of the plate has a surface area substantially larger than a contact area between the contacts and the dielectric sheet. The plate has a second side adapted to provide thermal contact with the heat conducting surface. In this manner, heat is transferred from the module to the heat conducting surface.

In accordance with another aspect of the present invention, a modular lighting apparatus is provided for conducting heat away from a light source of the apparatus. The apparatus comprises a plurality of LEDs and a circuit board. The circuit board has a main body and a plurality of electrically conductive contacts. Each of the LEDs electrically communicates with at least one of the contacts in a manner so that the LEDs are configured in a series array. Each of the LEDs electrically communicates with corresponding contacts at an attachment area defined on each contact. An overall surface of the contact is substantially larger than the attachment area. The plurality of contacts are arranged adjacent a first side of the main body and are in thermal communication with the first side of the main body. The main body electrically insulates the plurality of contacts relative to one another.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 13 is a schematic view of the apparatus of FIG. 9 mounted on a theater seat row end.

FIG. 14 is a side view of the apparatus of FIG. 13 showing the mounting orientation.

FIG. 15 is a side view of a mounting barb.

FIG. 26A is a side view of an alternative embodiment of a lighting module being mounted onto a channel illumination apparatus wall member.

FIG. 26B shows the apparatus of the arrangement of FIG. 26A with the lighting module installed.

FIG. 26C shows the arrangement of FIG. 26B with a lens installed on the wall member.

FIG. 26D shows a side view of an alternative embodiment of a lighting module installed on a channel illumination apparatus wall member.

DETAILED DESCRIPTION OF THE PREFERRED EMBODIMENT

Figure 1:
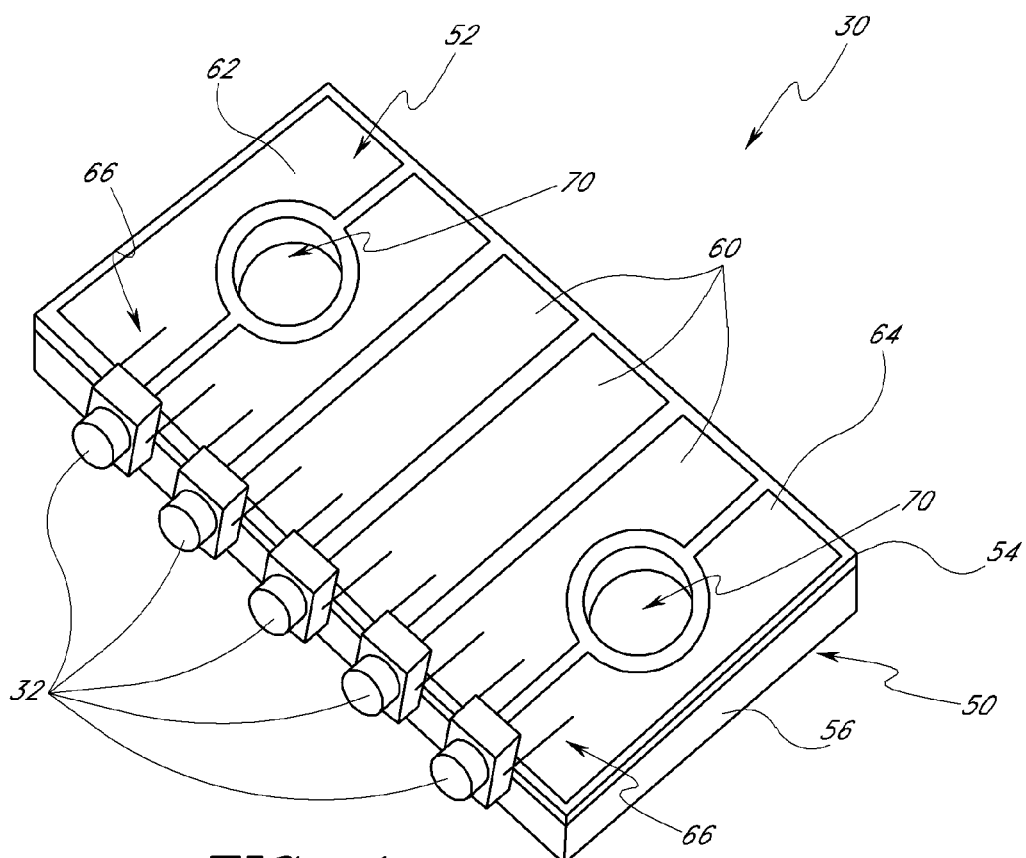
FIG. 1 is a perspective view of an LED module having features in accordance with the present invention.

With reference first to FIG. 1, an embodiment of a light-emitting diode (LED) lighting module 30 is disclosed. In the illustrated embodiment, the LED module 30 includes five pre-packaged LEDs 32 arranged on one side of the module 30. It is to be understood, however, that LED modules having features in accordance with the present invention can be constructed having any number of LEDs 32 mounted in any desired configuration.

Figure 2:
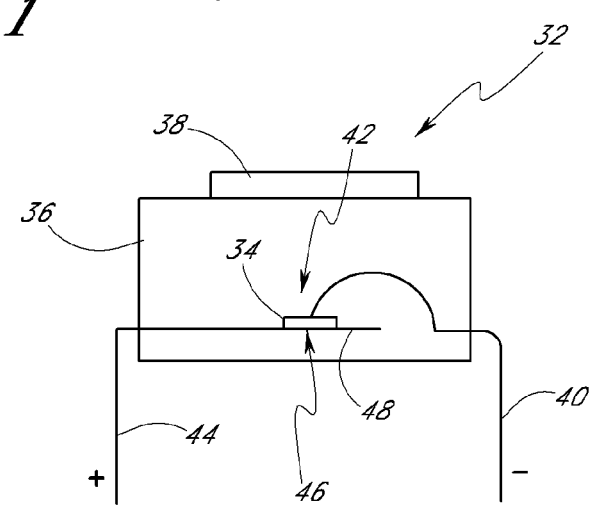
FIG. 2 is a schematic side view of a typical pre-packaged LED lamp.
Figures 3, 4:
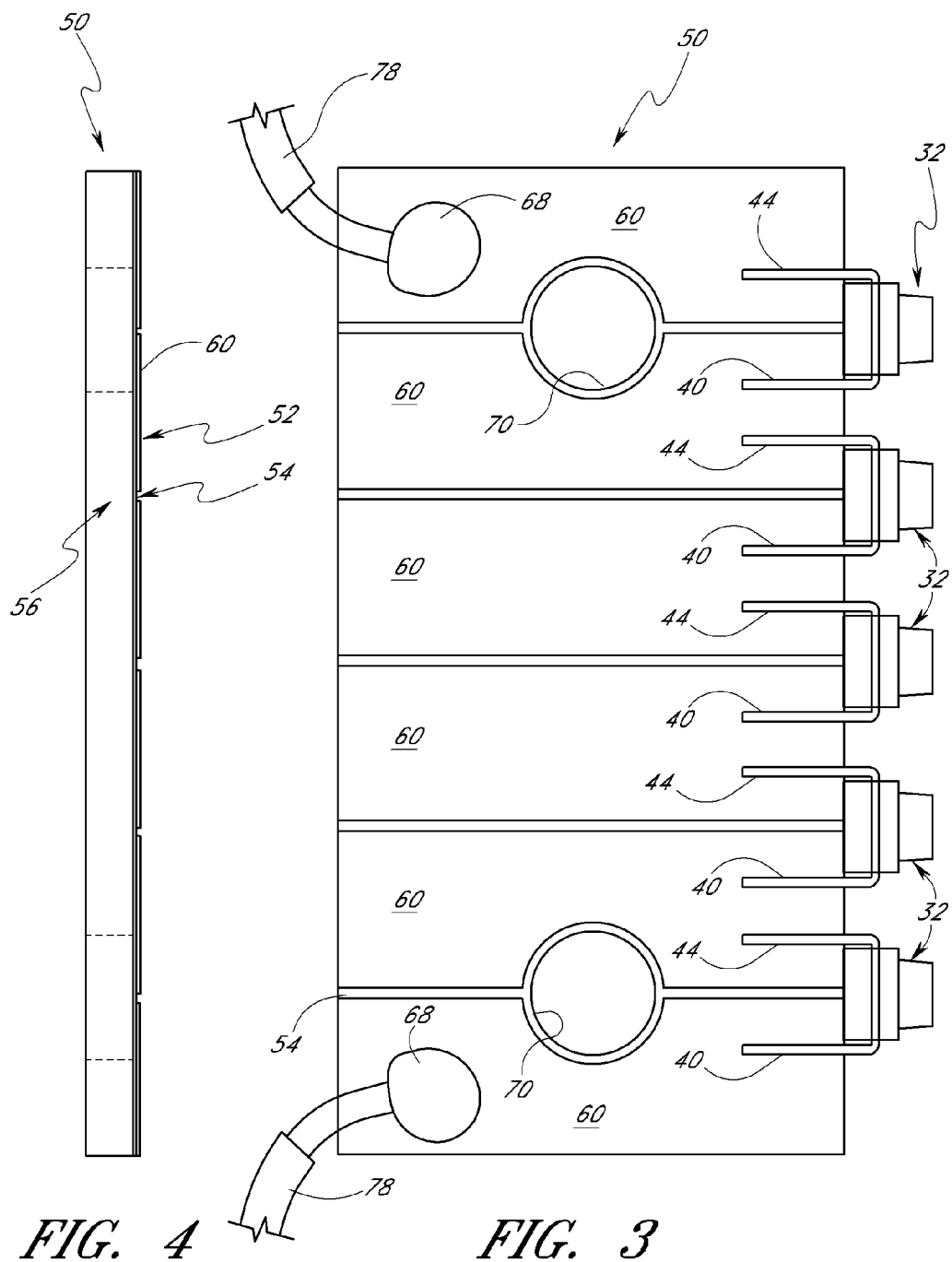
FIG. 3 is a top plan view of the LED module of FIG. 1.
FIG. 4 is a side plan view of the apparatus of FIG. 3.

With next reference to FIG. 2, a typical pre-packaged LED 32 includes a diode chip 34 encased within a resin body 36. The body 36 typically has a focusing lens portion 38. A negative lead 40 connects to an anode side 42 of the diode chip 34 and a positive lead 44 connects to a cathode side 46 of the diode chip 34. The positive lead 44 preferably includes a reflector portion 48 to help direct light from the diode 34 to the lens portion 38.

With next reference to FIGS. 1-5, the LED module 30 preferably comprises the five pre-packaged LED lamps 32 mounted in a linear array on a circuit board 50 and electrically connected in series. The illustrated embodiment employs pre-packaged aluminum indium gallium phosphide (AlInGaP) LED lamps 32 such as model HLMT-PL00, which is available from Hewlett Packard. In the illustrated embodiment, each of the pre-packaged LEDs is substantially identical so that they emit the same color of light. It is to be understood, however, that nonidentical LEDs may be used to achieve certain desired lighting effects.

The illustrated circuit board 50 preferably is about 0.05 inches thick, 1 inch long and 0.5 inch wide. It includes three layers: a copper contact layer 52, an epoxy dielectric layer 54 and an aluminum main body layer 56. The copper contact layer 52 is made up of a series of six elongate and generally parallel flat copper plates 60 that are adapted to attach to the leads 40, 44 of the LEDs 32. Each of the copper contacts 60 is electrically insulated from the other copper contacts 60 by the dielectric layer 54. Preferably, the copper contacts 60 are substantially coplanar.

The pre-packaged LEDs 32 are attached to one side of the circuit board 50, with the body portion 36 of each LED generally abutting a side of the circuit board 50. The LED lens portion 38 is thus pointed outwardly so as to direct light in a direction substantially coplanar with the circuit board 50. The LED leads 40, 44 are soldered onto the contacts 60 in order to create a series array of LEDs. Excess material from the leads of the individual pre-packaged LED lamps may be removed, if desired. Each of the contacts 60, except for the first and last contact 62, 64, have both a negative lead 40 and a positive lead 44 attached thereto. One of the first and last contacts 62, 64 has only a negative lead 40 attached thereto; the other has only a positive lead 44 attached thereto.

A bonding area of the contacts accommodates the leads 40, 44, which are preferably bonded to the contact 60 with solder 68; however, each contact 60 preferably has a surface area much larger than is required for adequate bonding in the bonding area 66. The enlarged contact surface area allows each contact 60 to operate as a heat sink, efficiently absorbing heat from the LED leads 40, 44. To maximize this role, the contacts 60 are shaped to be as large as possible while still fitting upon the circuit board 50.

The dielectric layer 54 preferably has strong electrical insulation properties but also relatively high heat conductance properties. In the illustrated embodiment, the layer 54 is preferably as thin as practicable. For example in the illustrated embodiment, the dielectric layer 54 comprises a layer of Thermagon® epoxy about 0.002 inches thick.

It is to be understood that various materials and thicknesses can be used for the dielectric layer 54. Generally, the lower the thermal conductivity of the material used for the dielectric layer, the thinner that dielectric layer should be in order to maximize heat transfer properties of the module. For example, in the illustrated embodiment, the layer of epoxy is very thin. Certain ceramic materials, such as beryllium oxide and aluminum nitride, are electrically non-conductive but highly thermally conductive. When the dielectric layer is constructed of such materials, it is not as crucial for the dielectric layer to be so very thin, because of the high thermal conductivity of the material.

In the illustrated embodiment, the main body 56 makes up the bulk of the thickness of the circuit board 50 and preferably comprises a flat aluminum plate. As with each of the individual contacts 60, the main body 56 functions as a heat conduit, absorbing heat from the contacts 60 through the dielectric layer 54 to conduct heat away from the LEDs 32. However, rather than just absorbing heat from a single LED 32, the main body 56 acts as a common heat conduit, absorbing heat from all of the contacts 60. As such, in the illustrated embodiment, the surface area of the main body 56 is about the same as the combined surface area of all of the individual contacts 60. The main body 56 can be significantly larger than shown in the illustrated embodiment, but its relatively compact shape is preferable in order to increase versatility when mounting the light module 30. Additionally, the main body 56 is relatively rigid and provides structural support for the lighting module 30.

In the illustrated embodiment, aluminum has been chosen for its high thermal conductance properties and ease of manufacture. It is to be understood, however, that any material having advantageous thermal conductance properties, such as having thermal conductivity greater than about 100 watts per meter per Kelvin (W/m-K), would be acceptable.

A pair of holes 70 are preferably formed through the circuit board 50 and are adapted to accommodate a pair of aluminum pop rivets 72. The pop rivets 72 hold the circuit board 50 securely onto a heat conductive mount member 76. The mount member 76 functions as or communicates with a heat sink. Thus, heat from the LEDs 32 is conducted with relatively little resistance through the module 30 to the attached heat sink 76 so that the junction temperature of the diode chip 34 within the LED 32 does not exceed a maximum desired level.

With reference again to FIGS. 3 and 5, a power supply wire 78 is attached across the first and last contacts 62, 64 of the circuit board 50 so that electrical current is provided to the series-connected LEDs 32. The power supply is preferably a 12-volt system and may be AC, DC or any other suitable power supply. A 12-volt AC system may be fully rectified.

The small size of the LED module 30 provides versatility so that modules can be mounted at various places and in various configurations. For instance, some applications will include only a single module for a particular lighting application, while other lighting applications will employ a plurality of modules electrically connected in parallel relative to each other.

It is also to be understood that any number of LEDs can be included in one module. For example, some modules may use two LEDs, while other modules may use 10 or more LEDs. One manner of determining the number of LEDs to include in a single module is to first determine the desired operating voltage of a single LED of the module and also the voltage of the power supply. The number of LEDs desired for the module is then roughly equal to the voltage of the power supply divided by the operating voltage of each of the LEDs.

The present invention rapidly conducts heat away from the diode chip 34 of each LED 32 so as to permit the LEDs 32 to be operated in regimes that exceed normal operating parameters of the pre-packaged LEDs 32. In particular, the heat sinks allow the LED circuit to be driven in a continuous, non-pulsed manner at a higher long-term electrical current than is possible for typical LED mounting configurations. This operating current is substantially greater than manufacturer-recommended maximums. The optical emission of the LEDs at the higher current is also markedly greater than at manufacturer-suggested maximum currents.

The heat transfer arrangement of the LED modules 30 is especially advantageous for pre-packaged LEDs 32 having relatively small packaging and for single-diode LED lamps. For instance, the HLMT-PL00 model LED lamps used in the illustrated embodiment employ only a single diode, but since heat can be drawn efficiently from that single diode through the leads and circuit board and into the heat sink, the diode can be run at a higher current than such LEDs are traditionally operated. At such a current, the single-diode LED shines brighter than LED lamps that employ two or more diodes and which are brighter than a single-diode lamp during traditional operation. Of course, pre-packaged LED lamps having multiple diodes can also be employed with the present invention. It is also to be understood that the relatively small packaging of the model HLMT-PL00 lamps aids in heat transfer by allowing the heat sink to be attached to the leads closer to the diode chip.

Figure 5:
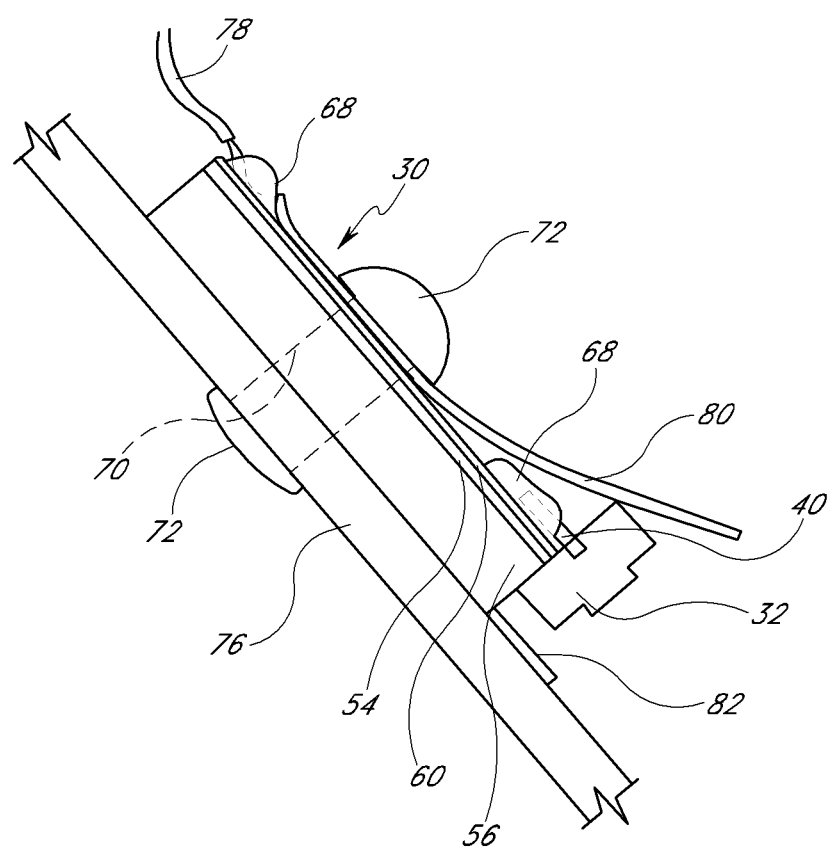
FIG. 5 is a close-up side view of the apparatus of FIG. 3 mounted on a heat conductive member.

With next reference to FIG. 5, a first reflective layer 80 is preferably attached immediately on top of the contacts 60 of the circuit board 50 and is held in position by the rivets 72. The first reflector 80 preferably extends outwardly beyond the LEDs 32. The reflective material preferably comprises an electrically non-conductive film such as visible mirror film available from 3M. A second reflective layer 82 is preferably attached to the mount member 76 at a point immediately adjacent the LED lamps 32. The second strip 82 is preferably bonded to the mount surface 76 using adhesive in a manner known in the art.

Figure 6:
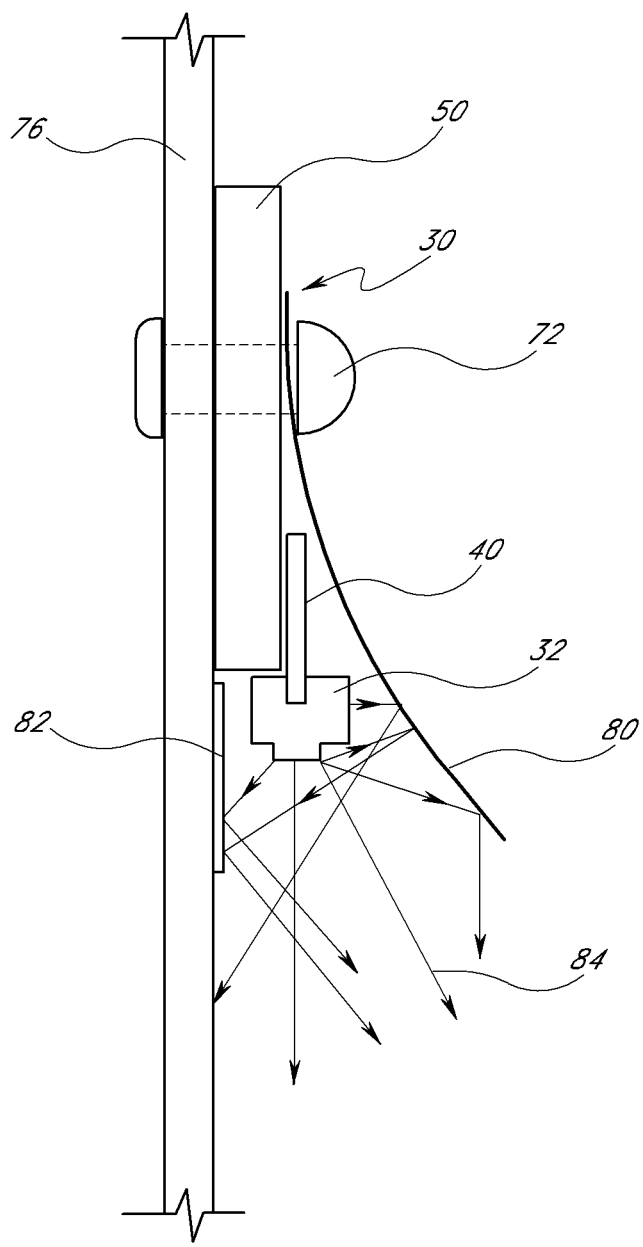
FIG. 6 is another sectional side view of the apparatus of FIG. 3 mounted onto a heat conductive flat surface.

With reference also to FIG. 6, the first reflective strip 80 is preferably bent so as to form a convex reflective trough about the LEDs 32. The convex trough is adapted to direct light rays emitted by the LEDs 32 outward with a minimum of reflections between the reflector strips 80, 82. Additionally, light from the LEDs is limited to being directed in a specified general direction by the reflecting films 80, 82. As also shown in FIG. 6, the circuit board 50 can be mounted directly to any mount surface 76.

In another embodiment, the aluminum main body portion 56 may be of reduced thickness or may be formed of a softer metal so that the module 30 can be partially deformed by a user. In this manner, the module 30 can be adjusted to fit onto various surfaces, whether they are flat or curved. By being able to adjust the fit of the module to the surface, the shared contact surface between the main body and the adjacent heat sink is maximized, improving heat transfer properties. Additional embodiments can use fasteners other than rivets to hold the module into place on the mount surface/heat sink material. These additional fasteners can include any known fastening means such as welding, heat conductive adhesives, and the like.

Figure 7:
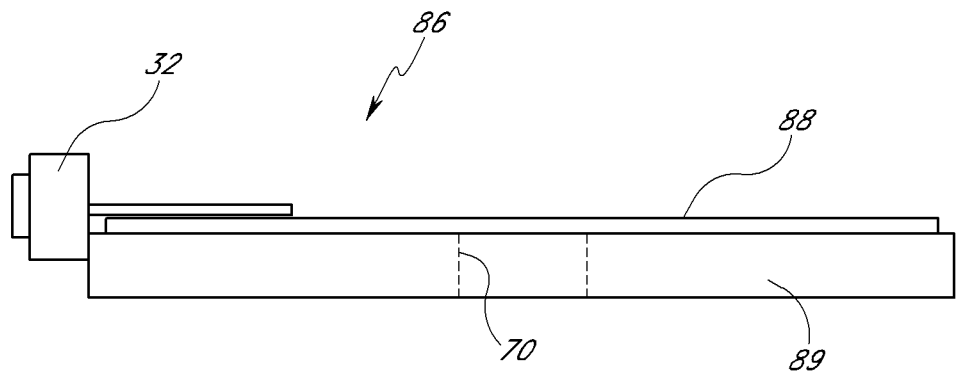
FIG. 7 is a side plan view of an LED module having features in accordance with another embodiment of the present invention.

As discussed above, a number of materials may be used for the circuit board portion of the LED module. With specific reference to FIG. 7, another embodiment of an LED module 86 comprises a series of elongate, flat contacts 88 similar to those described above with reference to FIG. 3. The contacts 88 are mounted directly onto the main body portion 89. The main body 89 comprises a rigid, substantially flat ceramic plate. The ceramic plate makes up the bulk of the circuit board and provides structural support for the contacts 88. Also, the ceramic plate has a surface area about the same as the combined surface area of the contacts. In this manner, the plate is large enough to provide structural support for the contacts 88 and conduct heat away from each of the contacts 88, but is small enough to allow the module 86 to be relatively small and easy to work with. The ceramic plate 89 is preferably electrically non-conductive but has high heat conductivity. Thus, the contacts 88 are electrically insulated relative to each other, but heat from the contacts 88 is readily transferred to the ceramic plate 89 and into an adjoining heat sink.

Figure 8:
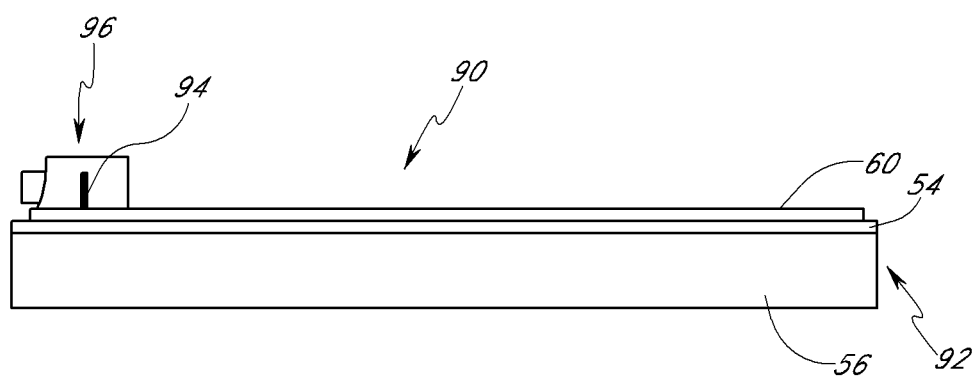
FIG. 8 is a side plan view of another LED module having features in accordance with yet another embodiment of the present invention.

With next reference to FIG. 8, another embodiment of an LED lighting module 90 is shown. The LED module 90 comprises a circuit board 92 having features substantially similar to the circuit board 50 described above with reference to FIG. 3. The diode portion 94 of the LED 96 is mounted substantially directly onto the contacts 60 of the lighting module 90. In this manner, any thermal resistance from leads of pre-packaged LEDs is eliminated by transferring heat directly from the diode 94 onto each heat sink contact 60, from which the heat is conducted to the main body 56 and then out of the module 90. In this configuration, heat transfer properties are yet further improved.

As discussed above, an LED module having features as described above can be used in many applications such as, for example, indoor and outdoor decorative lighting, commercial lighting, spot lighting, and even room lighting. With next reference to FIGS. 9-12, a self-contained lighting apparatus 100 incorporates an LED module 30 and can be used in many such applications. In the illustrated embodiment, the lighting apparatus 100 is adapted to be installed on the side of a row of theater seats 102, as shown in FIG. 13, and is adapted to illuminate an aisle 104 next to the theater seats 102.

Figure 9:
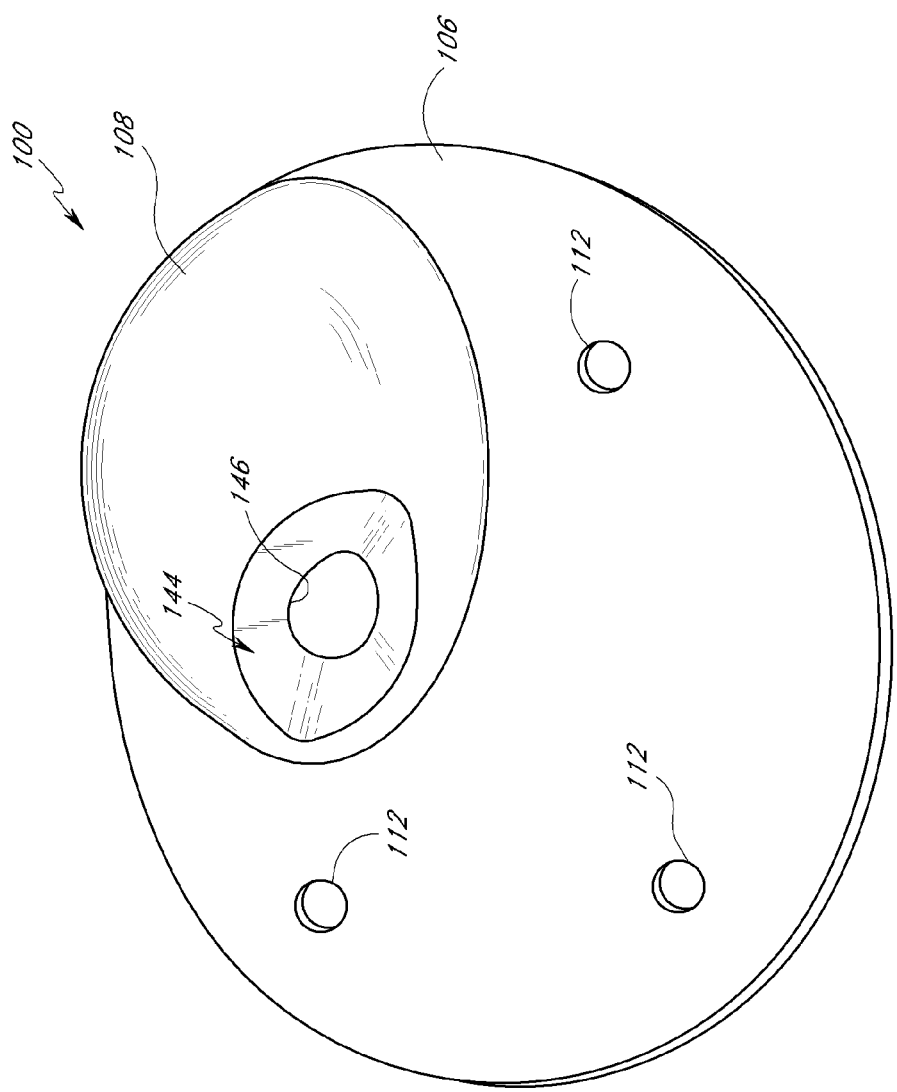
FIG. 9 is a perspective view of an illumination apparatus having features in accordance with the present invention.
Figure 10:
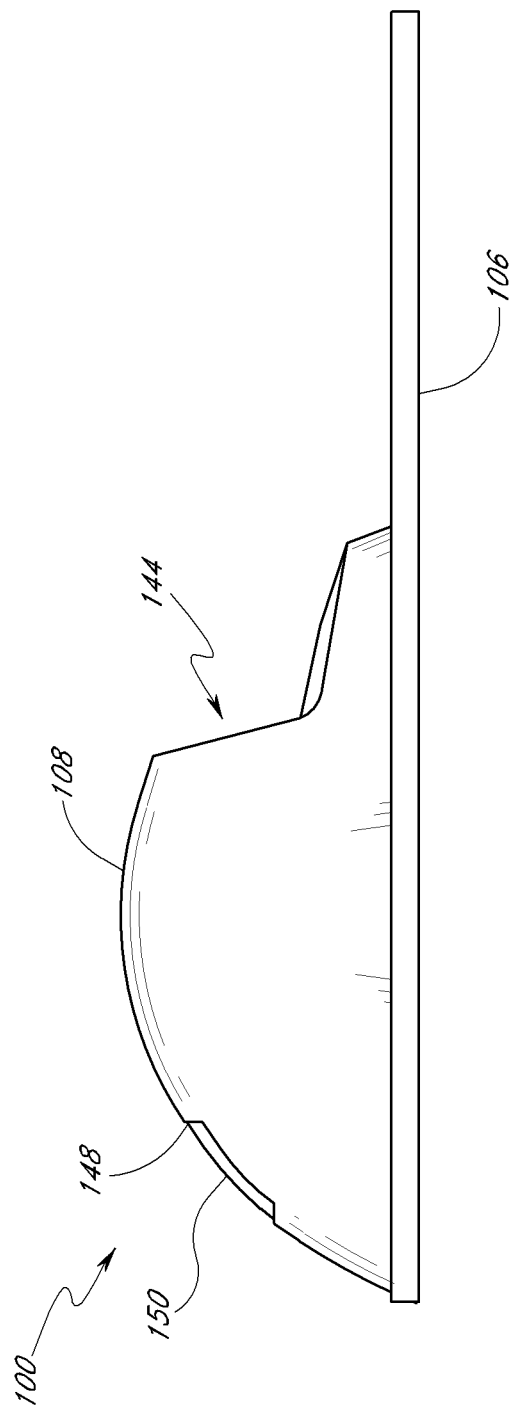
FIG. 10 is a side view of the apparatus of FIG. 9.
Figure 11:
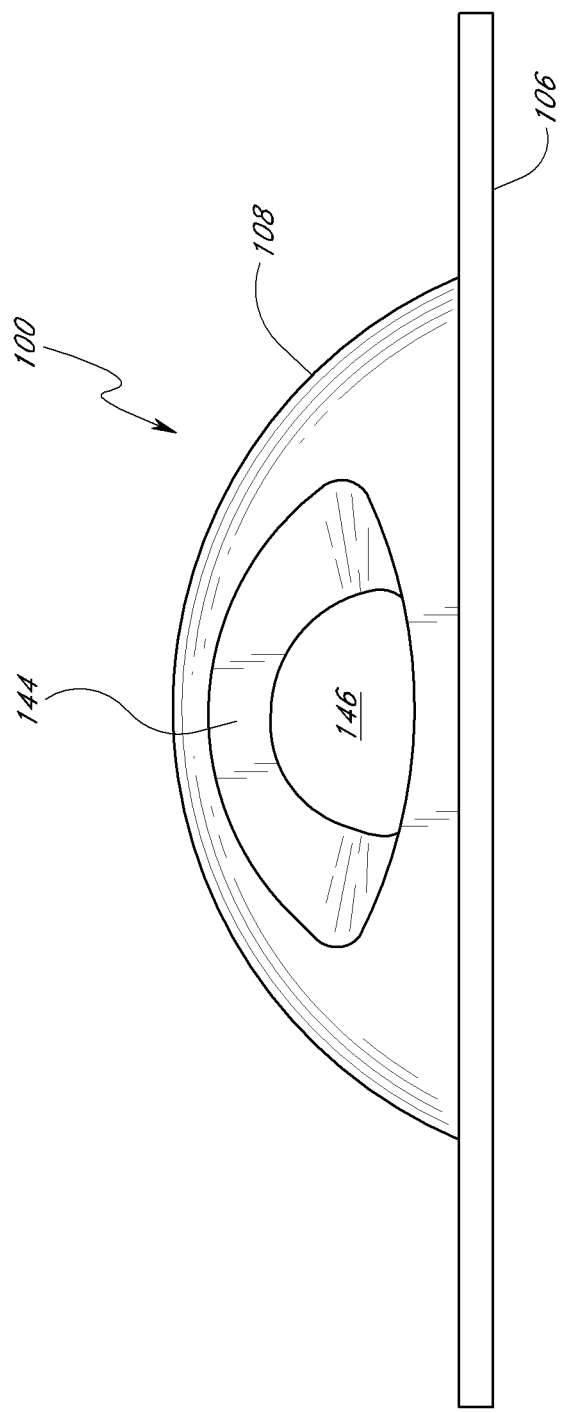
FIG. 11 is a bottom view of the apparatus of FIG. 9.
Figure 12:
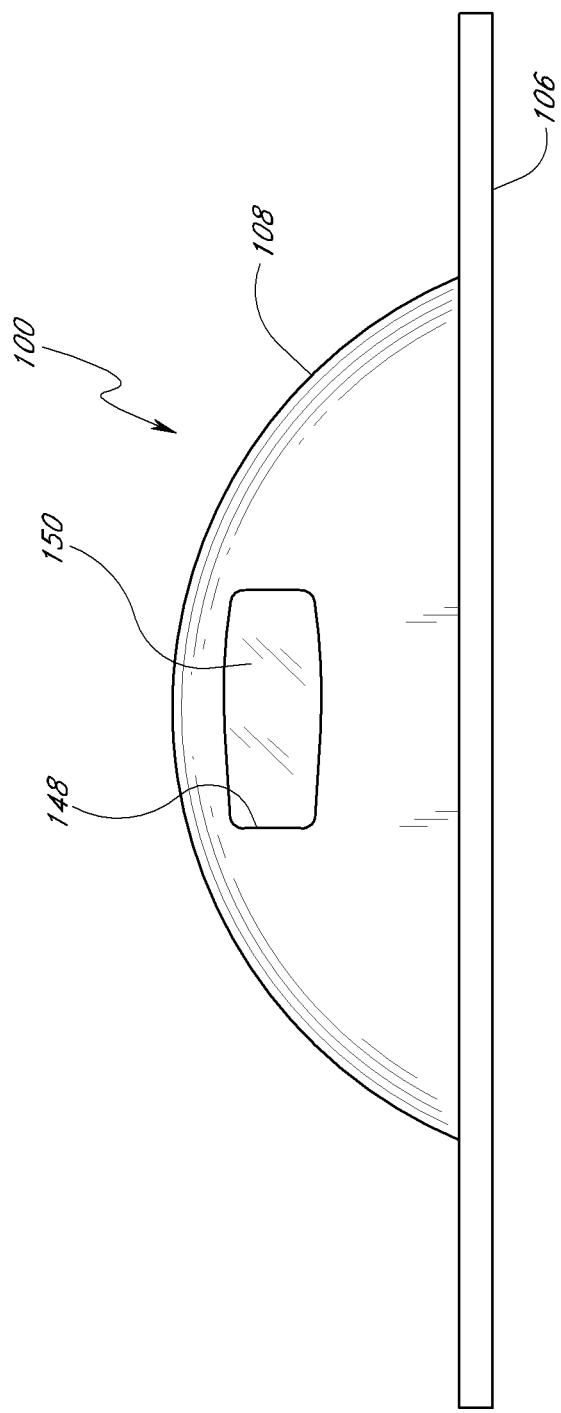
FIG. 12 is a top view of the apparatus of FIG. 9.

The self-contained lighting apparatus 100 comprises a base plate 106, a housing 108, and an LED module 30 arranged within the housing 108. As shown in FIGS. 9, 10 and 13, the base plate 106 is preferably substantially circular and has a diameter of about 5.75 inches. The base plate 106 is preferably formed of $\frac{1}{16}^{th}$ inch thick aluminum sheet. As described in more detail below, the plate functions as a heat sink to absorb and dissipate heat from the LED module. As such, the base plate 106 is preferably formed as large as is practicable, given aesthetic and installation concerns.

As discussed above, the lighting apparatus 100 is especially adapted to be mounted on an end panel 110 of a row of theater chairs 102 in order to illuminate an adjacent aisle 104. As shown in FIGS. 13 and 14, the base plate 106 is preferably installed in a vertical orientation. Such vertical orientation aids conductive heat transfer from the base plate 106 to the environment.

The base plate 106 includes three holes 112 adapted to facilitate mounting. A ratcheting barb 116 (see FIG. 15) secures the plate 106 to the panel 110. The barb 116 has an elongate main body 118 having a plurality of biased ribs 120 and terminating at a domed top 122.

To mount the apparatus on the end panel 110, a hole is first formed in the end panel surface on which the apparatus is to be mounted. The base plate holes 112 are aligned with mount surface holes and the barbs 116 are inserted through the base plate 106 into the holes. The ribs 120 prevent the barbs 116 from being drawn out of the holes once inserted. Thus, the apparatus is securely held in place and cannot be easily removed. The barbs 116 are especially advantageous because they enable the device to be mounted on various surfaces. For example, the barbs will securely mount the illumination apparatus on wooden or fabric surfaces.

With reference next to FIGS. 16-19, a mount tab 130 is provided as an integral part of the base plate 106. The mounting tab 130 is adapted to receive an LED module 30 mounted thereon. The tab 130 is preferably plastically deformed along a hinge line 132 to an angle θ between about 20-45° relative to the main body 134 of the base plate 106. More preferably, the mounting tab 130 is bent at an angle θ of about 33°. The inclusion of the tab 130 as an integral part of the base plate 106 facilitates heat transfer from the tab 130 to the main body 134 of the base plate. It is to be understood that the angle θ of the tab 130 relative to the base plate body 134 can be any desired angle as appropriate for the particular application of the lighting apparatus 100.

A cut out portion 136 of the base plate 106 is provided surrounding the mount tab 130. The cut out portion 136 provides space for components of the mount tab 130 to fit onto the base plate 106. Also, the cut out portion 136 helps define the shape of the mount tab 130. As discussed above, the mount tab 130 is preferably plastically deformed along the hinge line 132. The length of the hinge line 132 is determined by the shape of the cut out portion 136 in that area. Also, a hole 138 is preferably formed in the hinge line 132. The hole 138 further facilitates plastic deformation along the hinge line 132.

Figure 18:
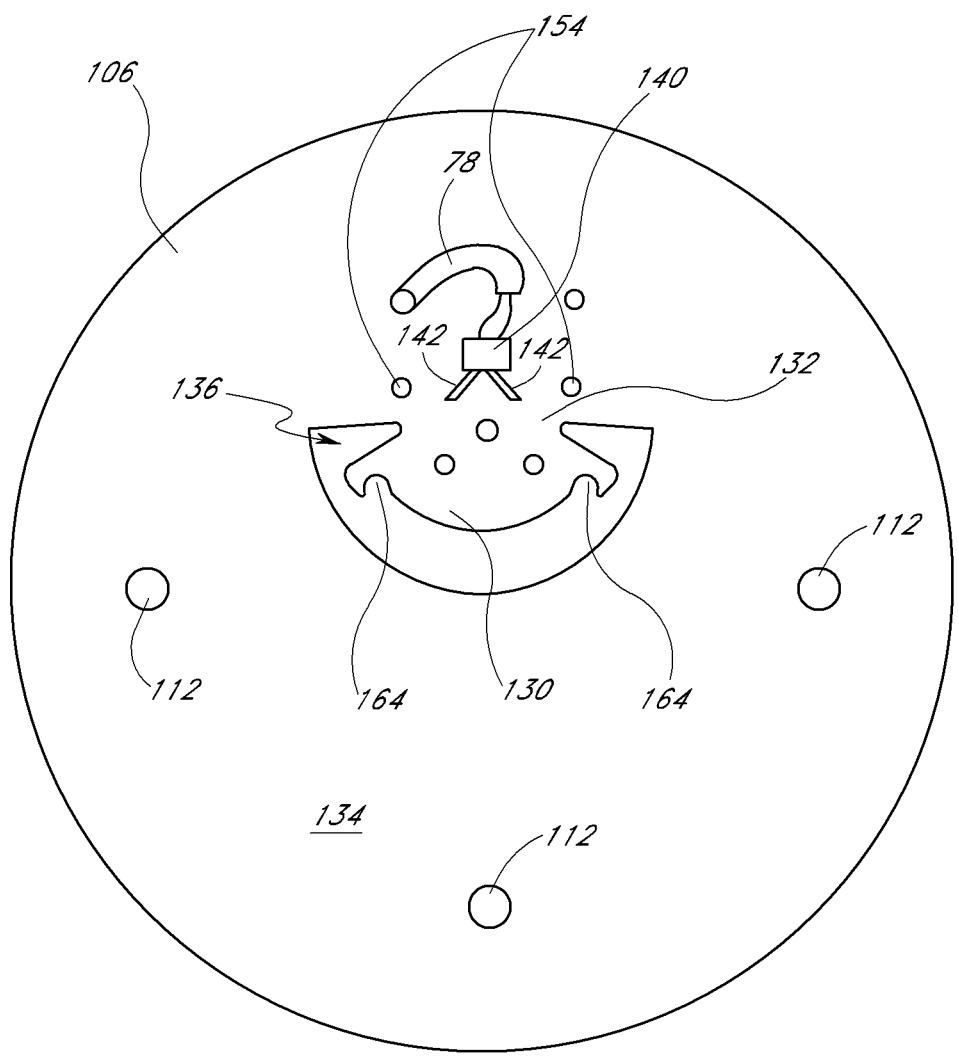
FIG. 18 is a schematic plan view of a heat sink base plate.
Figure 19:
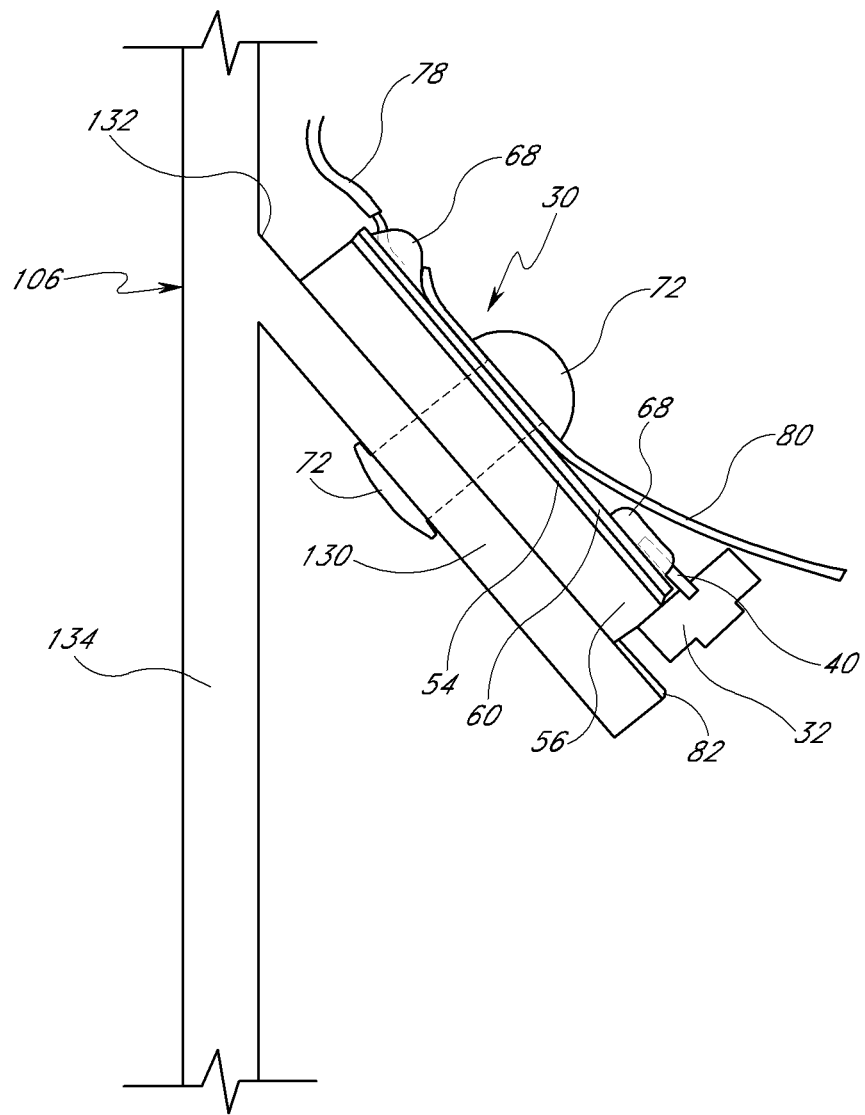
FIG. 19 is a close-up side sectional view of an LED module mounted on a mount tab of a base plate.

Power for the light source assembly 100 is preferably provided through a power cord 78 that enters the apparatus 100 through a back side of the base plate 106. The cord 78 preferably includes two 18 AWG conductors surrounded by an insulating sheet. Preferably, the power supply is in the low voltage range. For example, the power supply is preferably a 12-volt alternating current power source. As depicted in FIG. 18, power is preferably first provided through a full wave ridge rectifier 140 which rectifies the alternating current in a manner known in the art so that substantially all of the current range can be used by the LED module 40. In the illustrated embodiment, the LEDs are preferably not electrically connected to a current-limiting resistor. Thus, maximum light output can be achieved. It is to be understood, however, that resistors may be desirable in some embodiments to regulate current. Supply wires 142 extend from the rectifier 140 and provide rectified power to the LED module 30 mounted on the mounting tab 130.

With reference again to FIGS. 9-12, 16 and 17, the housing 108 is positioned on the base plate 106 and preferably encloses the wiring connections in the light source assembly 100. The housing 108 is preferably substantially semi-spherical in shape and has a notch 144 formed on the bottom side. A cavity 146 is formed through the notch 144 and allows visual access to the light source assembly 100. A second cavity 148 is formed on the top side and preferably includes a plug 150 which may, if desired, include a marking such as a row number. In an additional embodiment, a portion of the light from the LED module 30, or even from an alternative light source, may provide light to light up the aisle marker.

Figure 17:
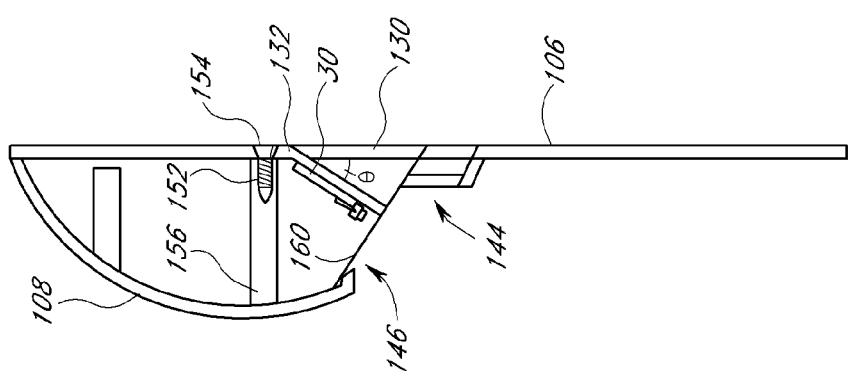
FIG. 17 is a cutaway side plan view of the apparatus of FIG. 20.

The housing 108 is preferably secured to the base plate 106 by a pair of screws 152. Preferably, the screws 152 extend through countersunk holes 154 in the base plate 106. This enables the base plate 106 to be substantially flat on the back side, allowing the plate to be mounted flush with the mount surface. As shown in FIG. 17, threaded screw receiver posts 156 are formed within the housing 108 and are adapted to accommodate the screw threads.

The LED module 30 is attached to the mount tab 130 by the pop rivets 72. The module 30 and rivets 72 conduct heat from the LEDs 32 to the mount tab 130. Since the tab 130 is integrally formed as a part of the base plate 106, heat flows freely from the tab 130 to the main body 134 of the base plate. The base plate 106 has high heat conductance properties and a relatively large surface area, thus facilitating efficient heat transfer to the environment and allowing the base plate 106 to function as a heat sink.

As discussed above, the first reflective strip 80 of the LED module 30 is preferably bent so as to form a convex trough about the LEDs. The second reflector strip 82 is attached to the base plate mount tab 130 at a point immediately adjacent the LED lamps 32. Thus, light from the LEDs is collimated and directed out of the bottom cavity 146 of the housing 108, while minimizing the number of reflections the light must make between the reflectors (see FIG. 6). Such reflections may each reduce the intensity of light reflected.

A lens or shield 160 is provided and is adapted to be positioned between the LEDs 32 and the environment outside of the housing cavity 108. The shield 160 prevents direct access to the LEDs 32 and thus prevents harm that may occur from vandalism or the like, but also transmits light emitted by the light source 100.

Figure 20:
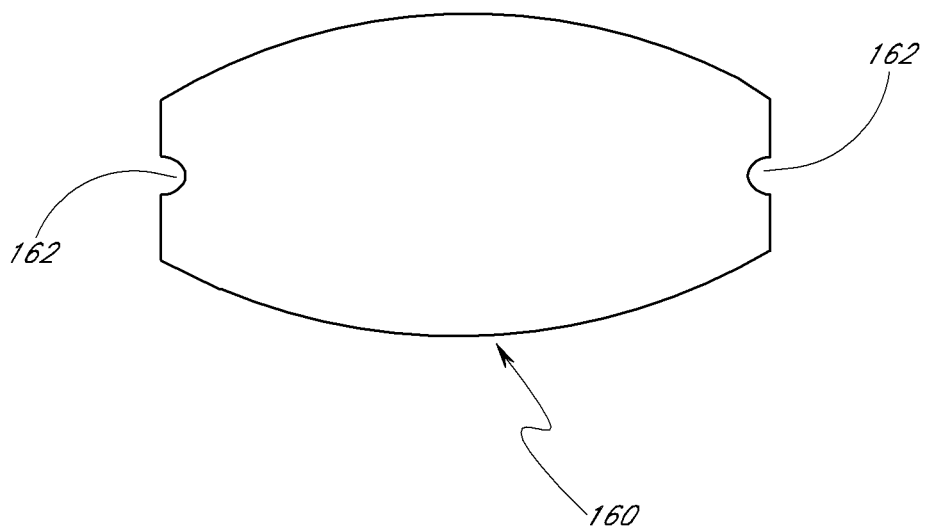
FIG. 20 is a plan view of a lens for use with the apparatus of FIG. 9.

FIG. 20 shows an embodiment of the shield 160 adapted for use in the present invention. As shown, the shield 160 is substantially lenticularly shaped and has a notch 162 formed on either end thereof. With reference back to FIG. 18, the mounting tab 130 of the base plate 106 also has a pair of notches 164 formed therein.

Figure 16:
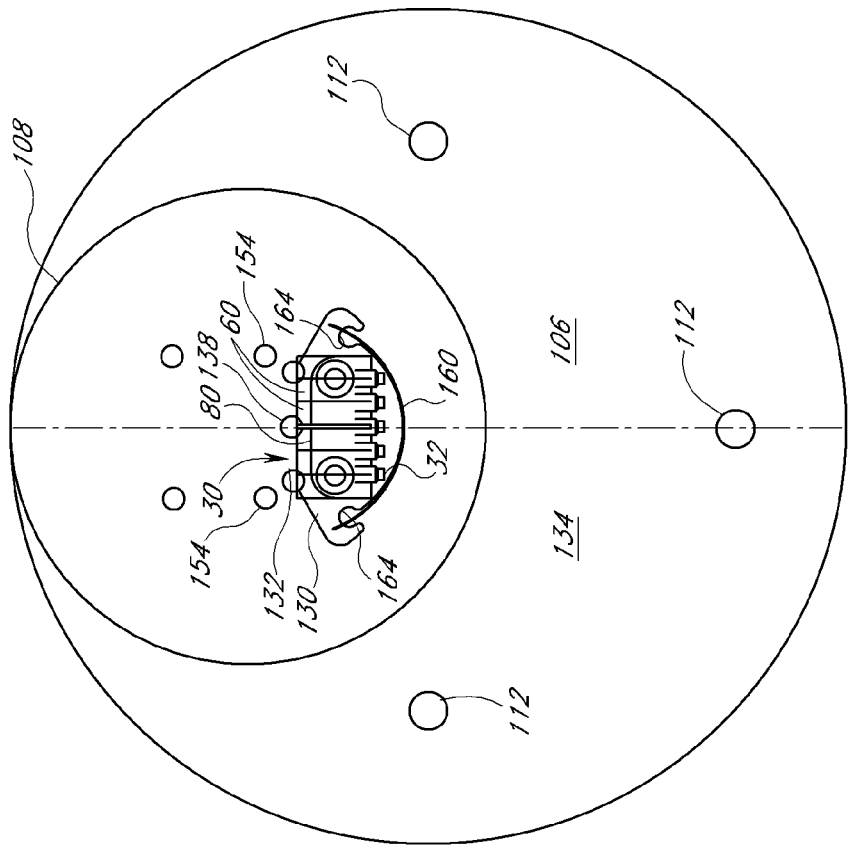
FIG. 16 is a front plan view of the illumination apparatus of FIG. 9.

As shown in FIG. 16, the lens/shield notches 162 are adapted to fit within the tab notches 164 so that the shield 160 is held in place in a substantially arcuate position. The shield thus, in effect, wraps around one side of the LEDs 32. When the shield 160 is wrapped around the LEDs 32, the shield 160 contacts the first reflector film 80, deflecting the film 80 to further form the film in a convex arrangement. The shield 160 is preferably formed of a clear polycarbonate material, but it is to be understood that the shield 160 may be formed of any clear or colored transmissive material as desired by the user.

The LED module 30 of the present invention can also be used in applications using a plurality of such modules 30 to appropriately light a lighting apparatus such as a channel illumination device. Channel illumination devices are frequently used for signage including borders and lettering. In these devices, a wall structure outlines a desired shape to be illuminated, with one or more channels defined between the walls. A light source is mounted within the channel and a translucent diffusing lens is usually arranged at the top edges of the walls so as to enclose the channel. In this manner, a desired shape can be illuminated in a desired color as defined by the color of the lens.

Typically, a gas-containing light source such as a neon light is custom-shaped to fit within the channel. Although the diffusing lens is placed over the light source, the light apparatus may still produce "hot spots," which are portions of the sign that are visibly brighter than other portions of the sign. Such hot spots result because the lighting apparatus shines directly at the lens, and the lens may have limited light-diffusing capability. Incandescent lamps may also be used to illuminate such a channel illumination apparatus; however, the hot spot problem typically is even more pronounced with incandescent lights.

Both incandescent and gas-filled lights have relatively high manufacturing and operation costs. For instance, gas-filled lights typically require custom shaping and installation and therefore can be very expensive to manufacture. Additionally, both incandescent and gas-filled lights have high power requirements.

Figure 21:
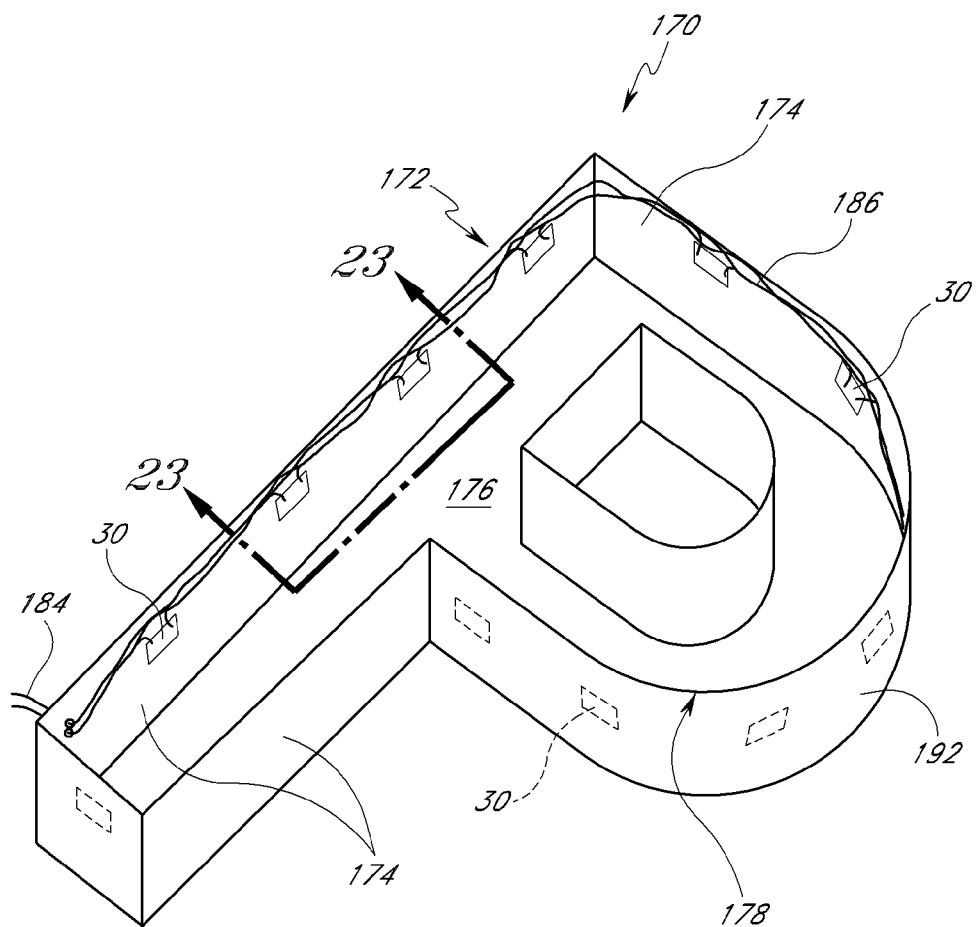
FIG. 21 is a perspective view of a channel illumination apparatus incorporating LED modules having features in accordance with the present invention.

With reference next to FIG. 21, an embodiment of a channel illumination apparatus 170 is disclosed comprising a casing 172 in the shape of a "P." The casing 172 includes a plurality of walls 174 and a bottom 176, which together define at least one channel. The surfaces of the walls 174 and bottom 176 are diffusely-reflective, preferably being coated with a flat white coating. The walls 174 are preferably formed of a durable sturdy metal having relatively high heat conductivity. A plurality of LED lighting modules 30 are mounted to the walls 174 of the casing 172 in a spaced-apart manner. A translucent light-diffusing lens (not shown) is preferably disposed on a top edge 178 of the walls 174 and encloses the channel.

Figure 22:
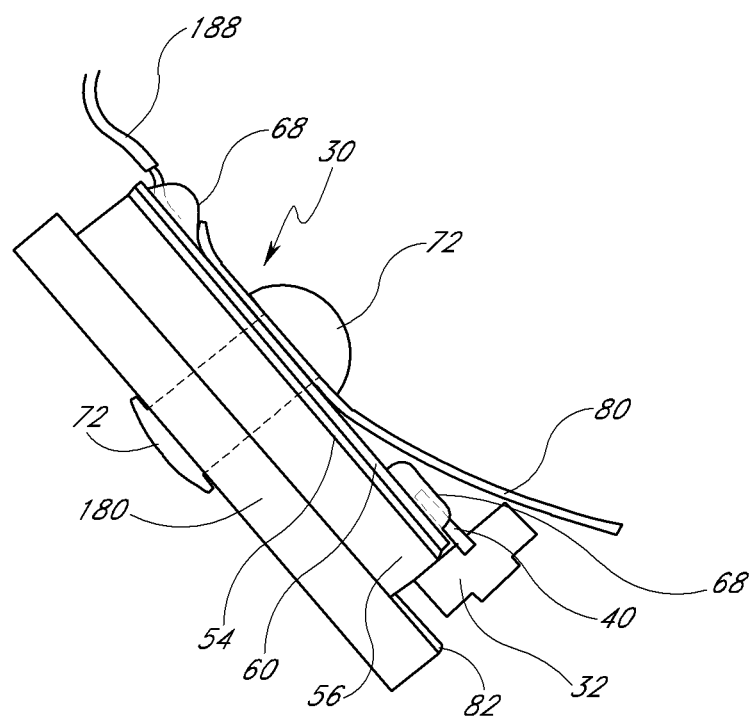
FIG. 22 is a close-up side view of an LED module mounted on a mount tab.
Figure 23:
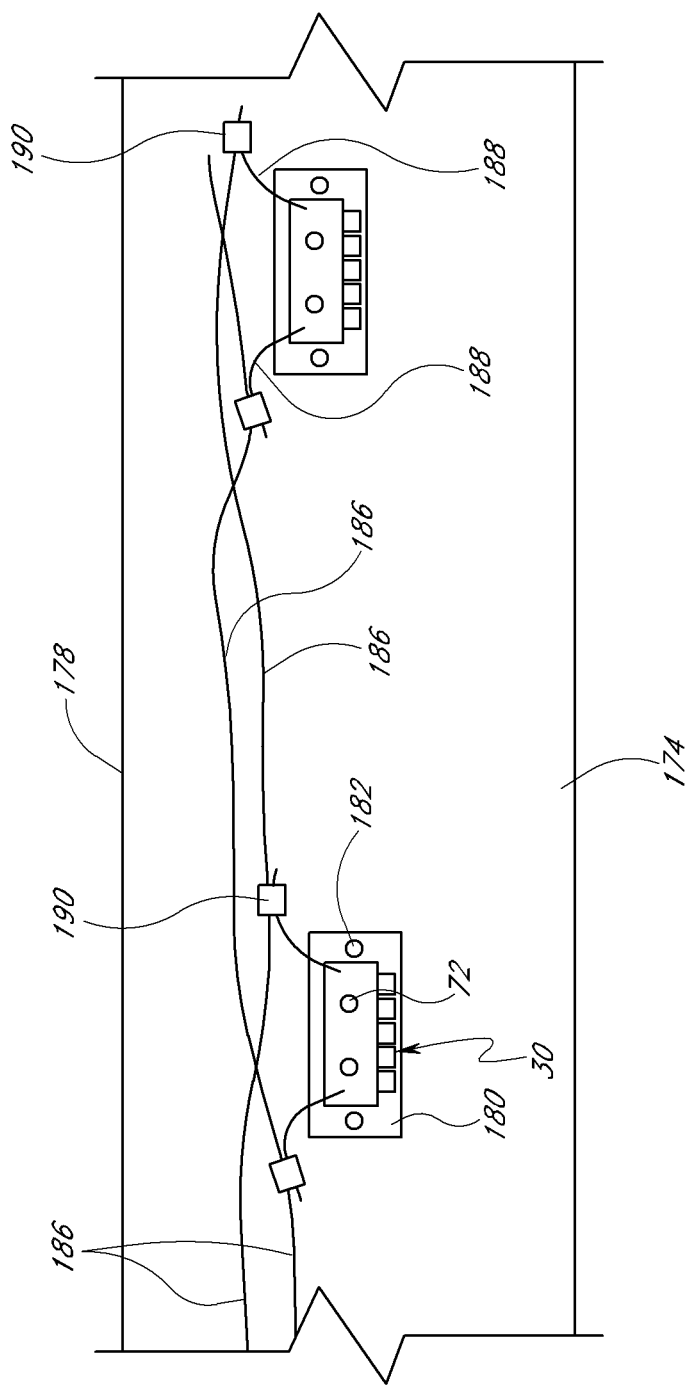
FIG. 23 is a partial view of a wall of the apparatus of FIG. 21, taken along line 23-23.

With next reference to FIG. 22, the pop rivets 72 hold the LED module 30 securely onto a heat conductive mount tab 180. The mount tab 180, in turn, may be connected, by rivets 182 or any other fastening means, to the walls 174 of the channel apparatus as shown in FIG. 23. Preferably, the connection of the mount tab 180 to the walls 174 facilitates heat transfer from the tab 180 to the wall 174. The channel wall has a relatively large surface area, facilitating efficient heat transfer to the environment and enabling the channel wall 174 to function as a heat sink.

In additional embodiments, the casing 172 may be constructed of materials, such as certain plastics, that may not be capable of functioning as heat sinks because of inferior heat conductance properties. In such embodiments, the LED module 30 can be connected to its own relatively large heat sink base plate, which is mounted to the wall of the casing. An example of such a heat sink plate in conjunction with an LED lighting module has been disclosed above with reference to the self-contained lighting apparatus 100.

With continued reference to FIGS. 22 and 23, the LED modules 30 are preferably electrically connected in parallel relative to other modules 30 in the illumination apparatus 170. A power supply cord 184 preferably enters through a wall 174 or bottom surface 176 of the casing 172 and preferably comprises two 18 AWG main conductors 186. Short wires 188 are attached to the first and last contacts 62, 64 of each module 30 and preferably connect with respective main conductors 186 using insulation displacement connectors (IDCs) 190 as shown in FIG. 23.

Although the LEDs 32 in the modules 30 are operated at currents higher than typical LEDs, the power efficiency characteristic of LEDs is retained. For example, a typical channel light employing a neon-filled light could be expected to use about 60 watts of power during operation. A corresponding channel illumination apparatus 170 using a plurality of LED modules can be expected to use about 4.5 watts of power.

With reference again to FIG. 23, the LED modules 30 are preferably positioned so that the LEDs 32 face generally downwardly, directing light away from the lens. The light is preferably directed to the diffusely-reflective wall and bottom surfaces 174, 176 of the casing 172. The hot spots associated with more direct forms of lighting, such as typical incandescent and gas-filled bulb arrangements, are thus avoided.

The reflectors 80, 82 of the LED modules 30 aid in directing light rays emanating from the LEDs toward the diffusely-reflective surfaces. It is to be understood, however, that an LED module 30 not employing reflectors can also be appropriately used.

The relatively low profile of each LED module 30 facilitates the indirect method of lighting because substantially no shadow is created by the module when it is positioned on the wall 174. A higher-profile light module would cast a shadow on the lens, producing an undesirable, visibly darkened area. To minimize the potential of shadowing, it is desired to space the modules 30 and accompanying power wires 186, 188 a distance of at least about ½ inch from the top edge 178 of the wall 174. More preferably, the modules 30 are spaced more than one inch from the top 178 of the wall 174.

Figure 24:
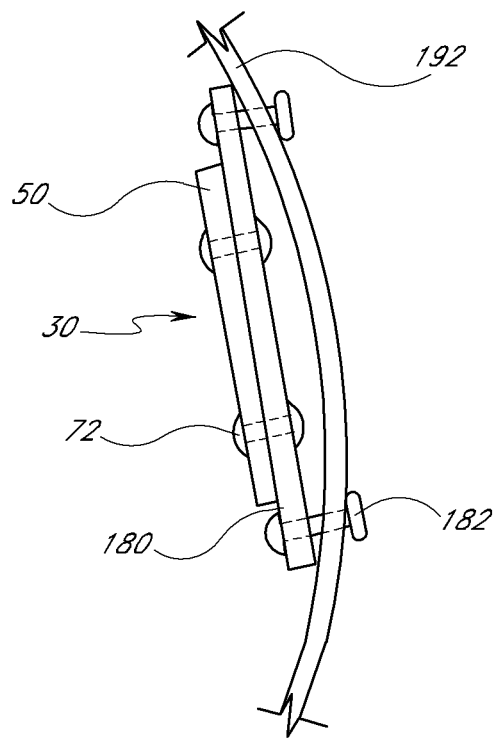
FIG. 24 is a top view of an LED module mounted to a wall of the apparatus of FIG. 21.

The small size and low profile of the LED modules 30 enables the modules to be mounted at various places along the channel wall 174. For instance, with reference to FIGS. 21 and 24, light modules 30 must sometimes be mounted to curving portions 192 of walls 174. The modules 30 are preferably about 1 inch to 1½ inch long, including the mounting tab 180, and thus can be acceptably mounted to a curving wall 192. As shown, the mounting tab 180 may be separated from the curving wall 192 along a portion of its length, but the module is small enough that it is suitable for riveting to the wall.

Figure 25:
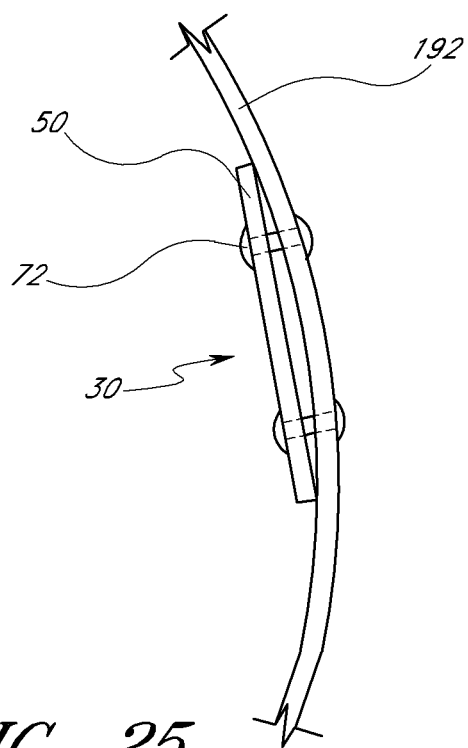
FIG. 25 is a top view of an alternative embodiment of an LED module mounted to a wall of the apparatus of FIG. 21.

In an additional embodiment shown in FIG. 25, the module 30 comprises the circuit board without the mount tab 180. In such an embodiment, the circuit board 50 may be mounted directly to the wall, having an even better fit relative to the curved surface 192 than the embodiment using a mount tab. In still another embodiment, the LED module's main body 56 is formed of a bendable material, which allows the module to fit more closely and easily to the curved wall surface.

Although the LED modules 30 disclosed above are mounted to the channel casing wall 174 with rivets 182, it is to be understood that any method of mounting may be acceptably used. With reference next to FIGS. 26A-C, an additional embodiment comprises an LED module 30 mounted to a mounting tab 200 which comprises an elongate body portion 202 and a clip portion 204. The clip portion 204 is urged over the top edge 178 of the casing wall 172, firmly holding the mounting tab 200 to the wall 174 as shown in FIG. 26B. The lens 206 preferably has a channel portion 208 which is adapted to engage the top edge 178 of the casing wall 174 and can be fit over the clip portion 204 of the mount tab 200 as shown in FIGS. 26B and 26C. This mounting arrangement is simple and provides ample surface area contact between the casing wall 174 and the mounting tab 200 so that heat transfer is facilitated.

In the embodiment shown in FIG. 21, the casing walls 174 are about 3 to 4 inches deep and the width of the channel is about 3 to 4 inches between the walls. In an apparatus of this size, LED modules 30 positioned on one side of the channel can provide sufficient lighting. The modules are preferably spaced about 5-6 inches apart. As may be anticipated, larger channel apparatus will likely require somewhat different arrangements of LED modules, including employing more LED modules. For example, a channel illumination apparatus having a channel width of 1 to 2 feet may employ LED modules on both walls and may even use multiple rows of LED modules. Additionally, the orientation of each of the modules may be varied in such a large channel illumination apparatus. For instance, with reference to FIG. 26D, some of the LED modules may desirably be angled so as to direct light at various angles relative to the diffusely reflective surfaces.

In order to avoid creating hot spots, a direct light path from the LED 32 to the lens 206 is preferably avoided. However, it is to be understood that pre-packaged LED lamps 32 having diffusely-reflective lenses may advantageously be directed toward the channel letter lens 206.

Using LED modules 30 to illuminate a channel illumination apparatus 170 provides significant savings during manufacturing. For example, a number of LED modules, along with appropriate wiring and hardware, can be included in a kit which allows a technician to easily assemble a light by simply securing the modules in place along the wall of the casing and connecting the wiring appropriately using the IDCs. Although rivet holes may have to be drilled through the wall, there is no need for custom shaping, as is required with gas-filled bulbs. Accordingly, manufacturing effort and costs are significantly reduced.

Individual LEDs emit generally monochromatic light. Thus, it is preferable that an LED type be chosen which corresponds to the desired illumination color. Additionally, the diffuser is preferably chosen to be substantially the same color as the LEDs. Such an arrangement facilitates desirable brightness and color results. It is also to be understood that the diffusely-reflective wall and bottom surfaces may advantageously be coated to match the desired illumination color.

Although this invention has been disclosed in the context of certain preferred embodiments and examples, it will be understood by those skilled in the art that the present invention extends beyond the specifically-disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method for making an illumination apparatus, comprising:
   providing a lighting module attached to a mount, the lighting module comprising:
      a plurality of light emitting diode (LED) packages, each LED package comprising a focusing lens portion and being adapted to direct light in a range of directions about a focus direction in which the lens is facing; and
      a circuit board comprising
         plural electrically-conductive contacts on the mounting face of the circuit board to which the LED packages are mounted such that the LED packages are electrically connected to the contacts;
   the mount comprising a heat conductive metal and having a surface area greater than a surface area of the electrically-conductive contacts on the mounting face of the circuit board;
   providing a housing comprising a first wall, a second wall, and a third wall that cooperate to define a casing having an opening;
   arranging the mount within the casing so that the focus directions of the lenses of the LED packages do not face the opening; and
   attaching the mount as arranged within the casing.

2. The method of claim 1 additionally comprising arranging the mount so that at least one of the LED packages faces the second wall of the housing.

3. The method of claim 2, wherein all of the LED package lenses of the lighting module face in the same general direction.

4. The method of claim 1, wherein arranging the mount comprises arranging the mount so that the lenses of the LED packages face generally away from the opening.

5. The method of claim 1, wherein all of the LED package lenses of the lighting module face in the same general direction.

6. The method of claim 1, comprising arranging the lighting modules so that each LED package focusing lens faces one or more of the first, second and third walls so that light from the LED bounces off of at least one of the walls before passing through the opening.

7. The method of claim 6, wherein each LED module circuit board comprises a dielectric and a heat conductive body, the dielectric having first and second sides, the dielectric being on the first side of the circuit board, the contacts being attached to the first side of the dielectric, and the heat conductive body being connected to the second side of the dielectric so that heat from the LED flows through the dielectric and to the heat conductive body.

8. The method of claim 1 additionally comprising fitting a light-diffusing lens over the channel opening.

9. The method of claim 7, wherein the mount is configured to function as a heat sink, so that heat from the LEDs flows through the dielectric to the heat conductive body and to the mount.

10. The method of claim 9, comprising attaching the mount to the casing so that a portion of the mount on which the lighting module is attached is spaced from each of the first, second and third walls.

11. An illumination apparatus, comprising:
   first, second and third walls that define a casing having an opening and being configured so that a light-diffusing lens fits over the opening;
   a heat conductive mount arranged in an interior of the casing and having a heat conductive surface;

a lighting module attached to the heat conductive mount, the lighting module comprising:
    a plurality of light emitting diode (LED) packages, each LED package comprising a focusing lens portion and being adapted to direct light in a range of directions about a focus direction in which the lens is facing; and
    a circuit board having a mounting face comprising a plurality of electrically conductive contacts, the LED packages electrically connected to the contacts;
the heat conductive surface having a surface area greater than a surface area of the circuit board contacts; and
the heat conductive mount arranged so that the lenses of the LED packages do not face the opening so that the focus direction is not directed at the opening.

12. An illumination apparatus as in claim 11, wherein the circuit board of the lighting module comprises a dielectric having a first side and a second side, the electrically conductive contacts being formed on the first side of the dielectric, a heat conductive body being on the second side of the dielectric.

13. An illumination apparatus as in claim 12, wherein the heat conductive body has a surface area less than the heat conductive surface area of the heat conductive mount.

14. An illumination apparatus as in claim 13, wherein part of the heat conductive mount is spaced from each of the first, second and third walls of the casing.

15. An illumination apparatus as in claim 14, wherein the heat conductive mount is attached to one of the first, second and third walls of the casing, and the LED package lenses face another one of the first, second and third walls of the casing.

16. An illumination apparatus as in claim 11, wherein part of the heat conductive mount is spaced from each of the first, second and third walls of the casing.

17. An illumination apparatus as in claim 16, wherein the heat conductive mount is attached to one of the first, second and third walls of the casing, and the LED package lenses face another one of the first, second and third walls of the casing.

18. An illumination apparatus as in claim 17, wherein the heat conductive mount has first and second ends that are fastened to the one of the first, second and third walls of the casing.

19. An illumination apparatus as in claim 17, wherein the heat conductive mount comprises a clip portion for attaching the heat conductive mount to the casing.

20. An illumination apparatus as in claim 16, wherein each LED package lens faces in the same direction.

* * * * *